(12) United States Patent
Forbes et al.

(10) Patent No.: US 7,544,989 B2
(45) Date of Patent: *Jun. 9, 2009

(54) HIGH DENSITY STEPPED, NON-PLANAR FLASH MEMORY

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 72 days.

This patent is subject to a terminal disclaimer.

(21) Appl. No.: 11/472,617

(22) Filed: Jun. 22, 2006

(65) Prior Publication Data

US 2006/0245255 A1 Nov. 2, 2006

Related U.S. Application Data

(62) Division of application No. 10/910,190, filed on Aug. 3, 2004, now Pat. No. 7,151,294.

(51) Int. Cl.
*H01L 29/94* (2006.01)
(52) U.S. Cl. ............ 257/315; 257/314; 257/E21.687; 365/185.18; 365/185.14; 438/259; 438/201
(58) Field of Classification Search ............ 257/314, 257/315, E21.68; 365/185, 170, 185.18, 365/185.14; 438/201, 259, 211, 257, 266, 438/241, 258
See application file for complete search history.

(56) References Cited

U.S. PATENT DOCUMENTS

| | | | |
|---|---|---|---|
| 5,077,691 A * | 12/1991 | Haddad et al. | 365/185.23 |
| 5,502,321 A * | 3/1996 | Matsushita | 257/316 |
| 5,936,274 A | 8/1999 | Forbes | |
| 5,973,356 A | 10/1999 | Noble | |
| 5,991,225 A | 11/1999 | Forbes | |
| 6,072,209 A | 6/2000 | Noble | |
| 6,097,065 A | 8/2000 | Forbes | |
| 6,124,729 A | 9/2000 | Noble | |
| 6,143,636 A | 11/2000 | Forbes | |
| 6,150,687 A | 11/2000 | Noble | |
| 6,153,468 A | 11/2000 | Forbes | |
| 6,238,976 B1 | 5/2001 | Noble | |
| 6,551,878 B2 | 4/2003 | Clampitt | |
| 2002/0167843 A1 * | 11/2002 | Hsia et al. | 365/185.28 |
| 2006/0183271 A1 * | 8/2006 | Forbes et al. | 438/128 |

OTHER PUBLICATIONS

P. Paven, et al., "Flash Memory Cells-An Overview," Proc. IEEE, vol. 85, No. 8, Aug. 1997, pp. 1248-1271.

D.-C. Kim et al., "A 2Gb NAND Flash Memory with 0.044 μm Cell Size using 90nm Flash Technology," IEEE IEDM, San Francisco, 2002, pp. 919-922.

(Continued)

*Primary Examiner*—Thinh T Nguyen
(74) *Attorney, Agent, or Firm*—Leffert Jay & Polglaze, P.A.

(57) ABSTRACT

A first plurality of memory cells is in a first plane in a first column of the array. A second plurality of memory cells is in a second plane in the same column. The second plurality of memory cells are coupled to the first plurality of memory cells through a series connection of their source/drain regions.

11 Claims, 5 Drawing Sheets

OTHER PUBLICATIONS

J.-D. Choi et al., "Highly Manufacturable 1 Gb NAND Flash Using 0.12 μm Process Technology," IEEE IDEM, Washington, D.C., 2001, pp. 25-28.

J.-D. Lee, S.-H. Hur, and J.-D. Choi, "Effects of Floating-Gate Interference on NAND Flash Memory Cell Operation," IEEE Electron Device Letters, vol. 23, No. 5, May 2002, pp. 264-266.

J. Plummer, "Silicon VLSI Technology, Fundamentals, Practice and Modeling," Prentice Hall, Upper Saddle River, N.J., © 2000, pp. 539-554.

G. Xue, et al., "Low Voltage Low Cost Nitride Embedded Flash Memory Cell," IMEC, Kapeldreef 75, B3001 Leuven Belgium, 19th IEEE Non-Volatile Semiconductor Memory Workshop, Monterey, CA, Feb. 16, 2003, pp. 62-64.

* cited by examiner

HIGH DENSITY STEPPED, NON-PLANAR FLASH MEMORY

RELATED APPLICATION

This Application is a Divisional of U.S. application Ser. No. 10/910,190, titled "HIGH DENSITY STEPPED, NON-PLANAR FLASH MEMORY," filed Aug. 3, 2004 now U.S. Pat. No. 7,151,294 which is commonly assigned and incorporated herein by reference.

TECHNICAL FIELD OF THE INVENTION

The present invention relates generally to memory devices and in particular the present invention relates to a flash memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

FIG. 1 shows a cross-section, along a wordline, of a typical prior art NAND flash memory array. The array is comprised of a silicon substrate 100 with a gate insulator layer 101 formed on top of the substrate 100. Shallow trench isolation (STI) areas 103 and 104 are formed between the bitlines. The floating gates 105 and 106 are formed between the oxide isolation areas 103 and 104. An interpoly insulator 107 is formed over the floating gates 105 and 106 prior to forming the control gate 110 on top. The memory array is comprised of multiple rows 120 and 121 of memory cell transistors.

FIG. 2 shows a cross-sectional view, along a bitline, of the typical prior art NAND flash memory array of FIG. 1. This view shows the source/drain regions 201 and 202 for each cell as well as the gate insulator 101, floating gate 105, interpoly insulator 107, and control gate 110 that is part of the wordline. One bit is typically stored on each floating gate in such a flash memory. If F describes the minimum feature size, then the density is one bit for each 4 $F^2$ units of surface area. This is normally described as a density of 4 $F^2$/bit.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions.

For the reasons stated above, and for other reasons stated below which will become apparent to those skilled in the art upon reading and understanding the present specification, there is a need in the art for a higher performance flash memory transistor.

DETAILED DESCRIPTION

Figure 1:
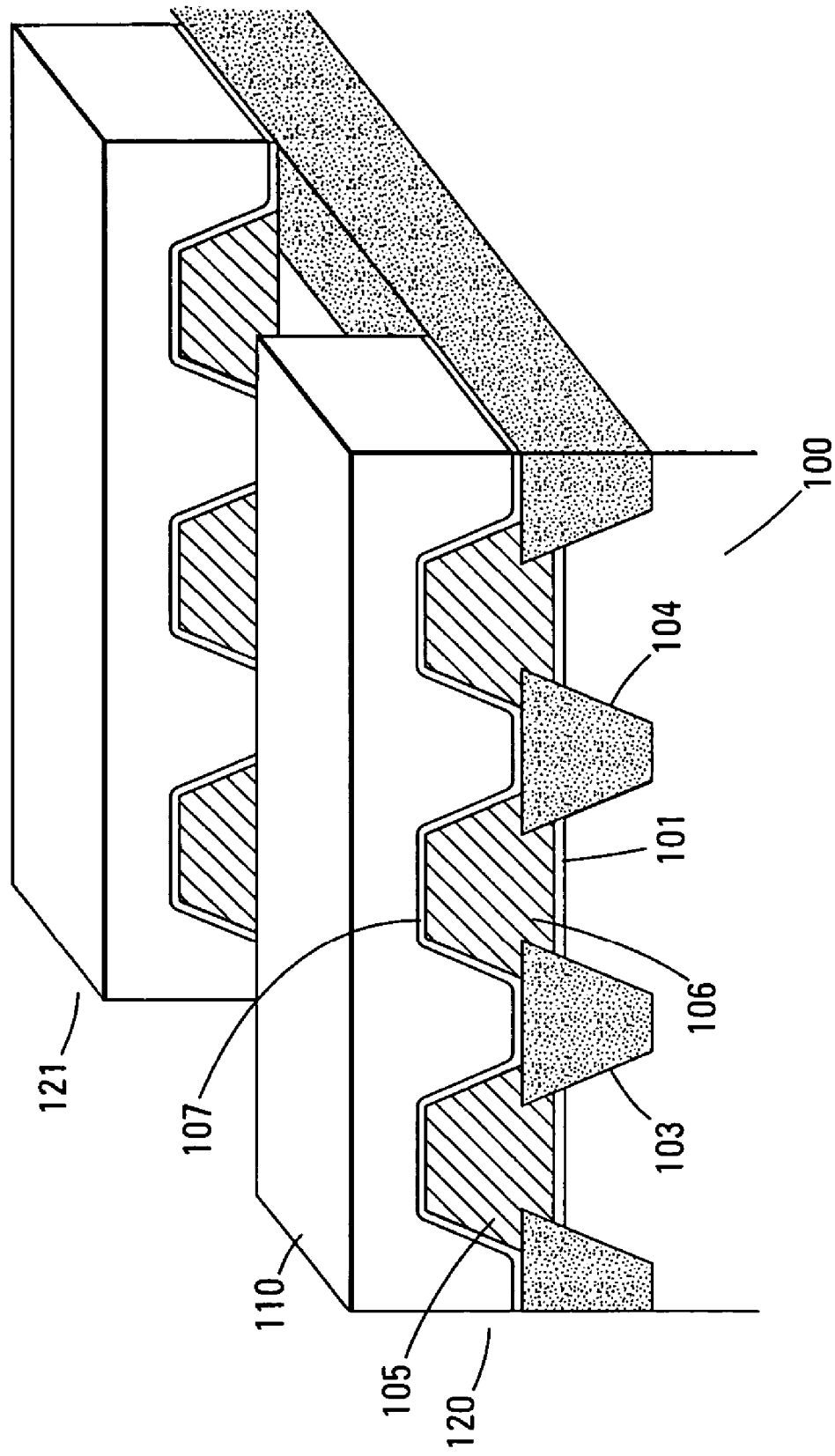
FIG. 1 shows a cross-sectional view, along a wordline, of a typical prior art NAND flash memory cell array.
Figure 2:
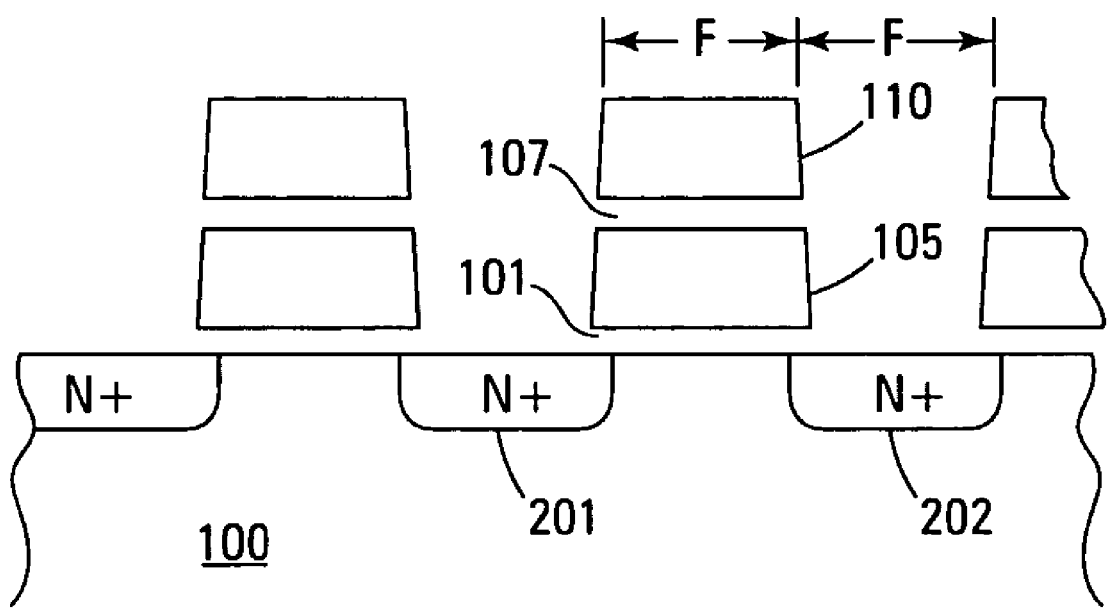
FIG. 2 shows a cross-sectional view, along a bitline, of a typical prior art flash memory cell array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 3:
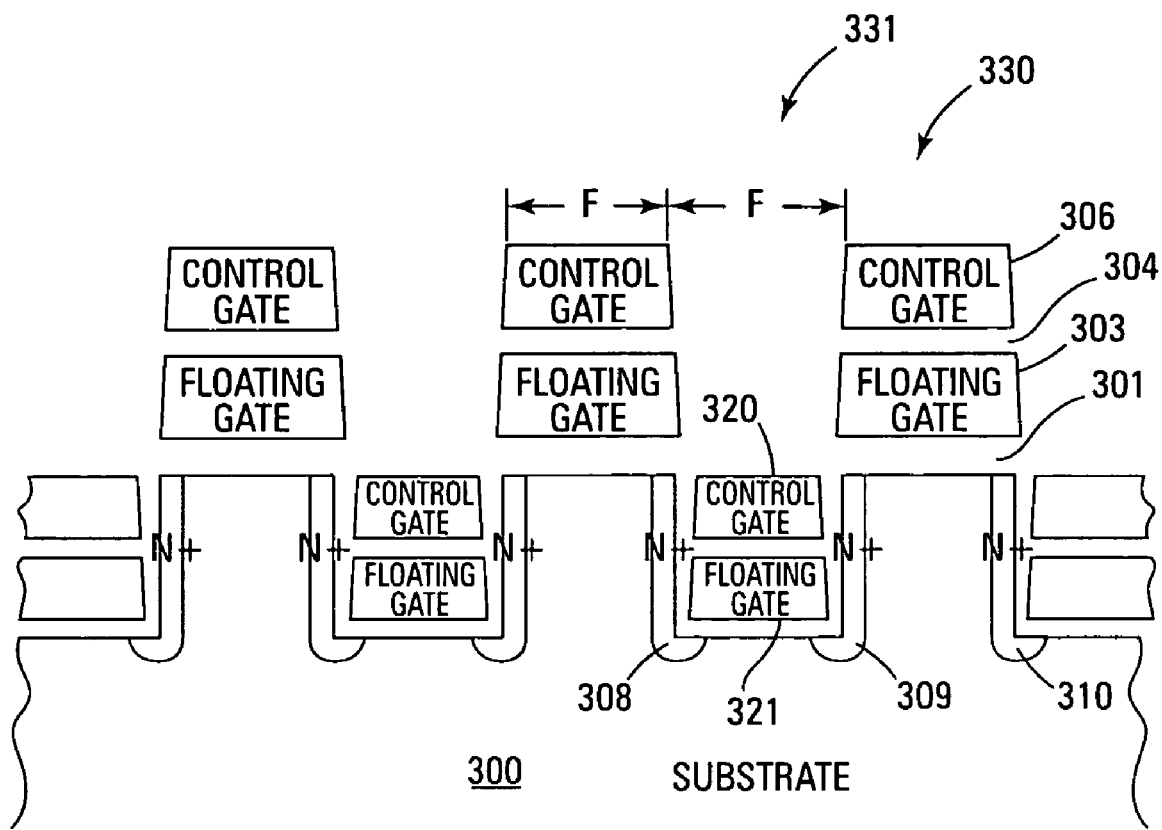
FIG. 3 shows a cross-sectional view of one embodiment of a stepped, non-planar flash memory array of the present invention.

FIG. 3 illustrates a cross-sectional view of one embodiment of a stepped, non-planar flash memory array of the present invention. The memory cells are fabricated on a trenched surface with steps between the adjacent devices along the row of series connected transistors. The transistors are not vertical structures but are conventional devices with conduction in channels that are parallel to the substrate surface. These devices achieve a density of 2 $F^2$/bit with single level storage.

A portion of the array illustrated in FIG. 3 is comprised of a column of transistors of which two 330 and 331 are discussed. An upper transistor 330 is fabricated on a pillar on the substrate 300. Two source/drain regions 309 and 310 are doped into the pillar. These regions 308-310 couple adjacent transistors of each plane together into columns of a NAND architecture. A channel region exists at the top of the pillar such that, during operation of the transistor 330, a channel forms between the source/drain regions 309 and 310 in the channel region.

In one embodiment, the source/drain regions 309 and 310 are N+ regions that are doped into a p-type substrate. However, the source/drain regions and substrate of the present invention are not limited to any one conductivity type.

A gate insulator layer 301 is formed over the channel region. A floating gate 303 is formed over the gate insulator 301 and an intergate insulator 304 is formed over this layer 303. The control gate/wordline 306 is formed over the intergate insulator 304.

A second transistor 331 is formed in a trench of the substrate 300. The walls of the trench contain the source/drain regions 308 and 309 for this device 331. A channel region for the transistor 331 exists at the bottom of the trench between the two source/drain regions 308 and 309. The floating gate 321 and control gate/wordline 320 layers are formed over their respective gate insulator and intergate insulator in the trench.

The gate insulator and intergate insulator between the polysilicon gates can be high-k dielectrics (i.e., dielectric constant greater than that of $SiO_2$), composite insulators, silicon oxide, or some other insulator. Silicon dioxide ($SiO_2$) is an insulator with a relative dielectric constant of 3.9. A high-k gate insulator requires smaller write and erase voltages due to the reduced thickness layer between the control gate and the floating gate. These dielectric layers may be formed by atomic layer deposition (ALD), evaporation, or some other fabrication technique.

As is well known in the art, ALD is based on the sequential deposition of individual monolayers or fractions of a monolayer in a well-controlled manner. Gaseous precursors are introduced one at a time to the substrate surface and between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor. The most commonly used oxygen source materials for ALD are water, hydrogen peroxide, and ozone. Alcohols, oxygen and nitrous oxide can also been used.

ALD is well suited for deposition of high-k dielectrics such as $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2$/Hf, $ZrAl_xO_y$, $CrTiO_3$, and $ZrTiO_4$.

The dielectric layers of the present invention can also be formed by evaporation. Dielectric materials formed by evaporation can include: $TiO_2$, $HfO_2$, $CrTiO_3$, $ZrO_2$, $Y_2O_3$, $Gd_2O_3$, $PrO_2$, $ZrO_xN_x$, Y—Si—O, and $LaAlO_3$.

Very thin films of $TiO_2$ can be fabricated with electron-gun evaporation from a high purity $TiO_2$ slug (e.g., 99.9999%) in a vacuum evaporator in the presence of an ion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3-4 in. in diameter) is located above the electron gun and argon gas is used to generate Ar ions to bombard the substrate surface uniformly during the film deposition to compact the growing $TiO_2$ film.

A two-step process is used in fabricating a high purity $HfO_2$ film. This method avoids the damage to the silicon surface by Ar ion bombardment, such as that encountered during Hf metal deposition using dc sputtering. A thin Hf film is deposited by simple thermal evaporation. In one embodiment, this is by electron-beam evaporation using a high purity Hf metal slug (e.g., 99.9999%) at a low substrate temperature (e.g., 150°-200° C.). Since there is no plasma and ion bombardment of the substrate (as in the case of sputtering), the original atomically smooth surface of the silicon substrate is maintained. The second step is oxidation to form the desired $HfO_2$.

The first step in the deposition of CoTi alloy film is by thermal evaporation. The second step is the low temperature oxidation of the CoTi film at 400° C. Electron beam deposition of the CoTi layer minimizes the effect of contamination during deposition. The CoTi films prepared from an electron gun possess the highest purity because of the high-purity starting material. The purity of zone-refined starting metals can be as high as 99.999%. Higher purity can be obtained in deposited films because of further purification during evaporation.

A two step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°-200° C.). Since there is no plasma and ion bombardment of the substrate, the original atomically smooth surface of the silicon substrate is maintained. The second step is the oxidation to form the desired $ZrO_2$.

The fabrication of $Y_2O_3$ and $Gd_2O_3$ films may be accomplished with a two step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering. A thin film of Y or Gd is deposited by thermal evaporation. In one embodiment, an electron-beam evaporation technique is used with an ultra-high purity Y or Gd metal slug at a low substrate temperature (e.g., 150°-200° C.). Since there is no plasma or ion bombardment of the substrate, the original atomically smooth surface of the silicon substrate is maintained. The second step is the oxidation to form the desired $Y_2O_3$ or $Gd_2O_3$.

The desired high purity of a $PrO_2$ film can be accomplished by depositing a thin film by simple thermal evaporation. In one embodiment, this is accomplished by an electron-beam evaporation technique using an ultra-high purity Pr metal slug at a low substrate temperature (e.g., 150°-200° C.). Since there is no plasma and ion bombardment of the substrate, the original atomically smooth surface of the silicon substrate is maintained. The second step includes the oxidation to form the desired $PrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

The formation of a Y—Si—O film may be accomplished in one step by co-evaporation of the metal (Y) and silicon dioxide ($SiO_2$) without consuming the substrate Si. Under a suitable substrate and two-source arrangement, yttrium is evaporated from one source, and $SiO_2$ is from another source. A small oxygen leak may help reduce the oxygen deficiency in the film. The evaporation pressure ratio rates can be adjusted easily to adjust the Y—Si—O ratio.

The prior art fabrication of lanthanum aluminate ($LaAlO_3$) films has been achieved by evaporating single crystal pellets on Si substrates in a vacuum using an electron-beam gun. The evaporation technique of the present invention uses a less expensive form of dry pellets of $Al_2O_3$ and $La_2O_3$ using two electron guns with two rate monitors. Each of the two rate monitors is set to control the composition. The composition of the film, however, can be shifted toward the $Al_2O_3$ or $La_2O_3$ side depending upon the choice of dielectric constant. After deposition, the wafer is annealed ex situ in an electric furnace at 700° C. for ten minutes in $N_2$ ambience. In an alternate embodiment, the wafer is annealed at 800°-900° C. in RTA for ten to fifteen seconds in $N_2$ ambience.

The above described ALD and evaporation techniques are for purposes of illustration only. The embodiments of the present invention are not limited to any one dielectric material or dielectric fabrication technique.

Figure 4:
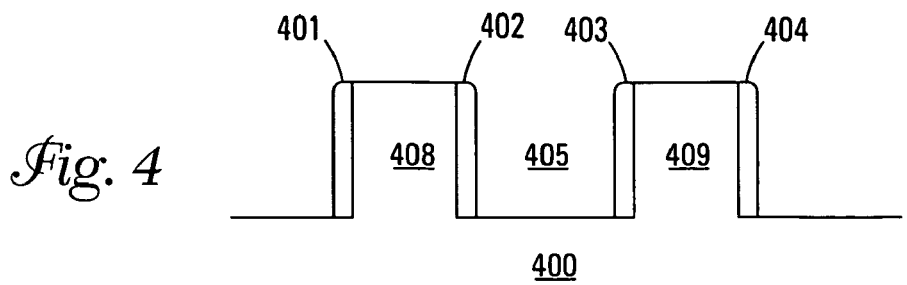
FIG. 4 shows a cross-sectional view of fabrication steps for one embodiment of the present invention in accordance with the array of FIG. 3.

FIG. 4 illustrates an embodiment for fabricating the non-planar flash memory array of FIG. 3. The substrate 400 is etched to produce trenches 405 between the substrate pillars 408 and 409. A doped oxide is deposited over the trenches 405 and pillars 408 and 409. This oxide layer is directionally etched to leave the oxide only on the sidewalls 401-404 of the trenches. During a subsequent anneal process, this forms the source/drain regions of the transistors. The sidewall 401-404 oxide layers are then removed and followed by a gate oxidation and/or deposition of a gate insulator.

Figure 5:
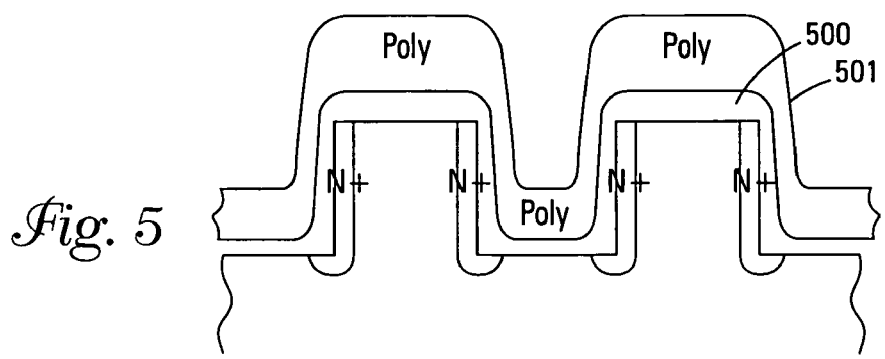
FIG. 5 shows a cross-sectional view of additional steps for one embodiment of the fabrication method of the present invention in accordance with the array of FIG. 3.
Figure 6:
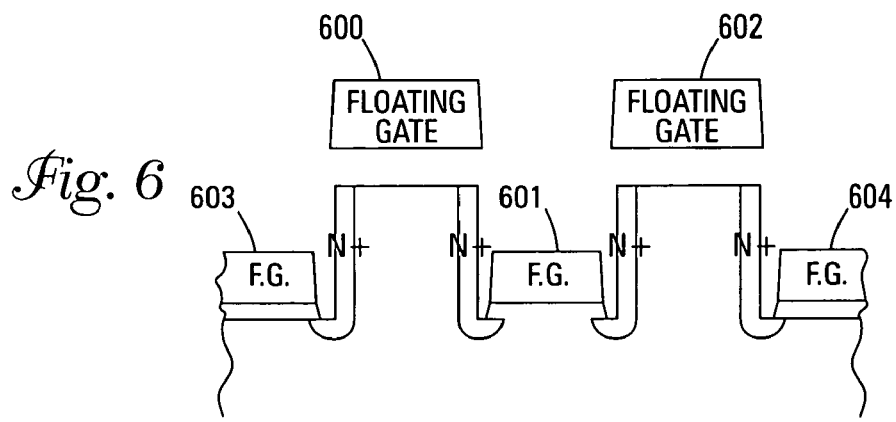
FIG. 6 shows a cross-sectional view of additional steps for one embodiment of the fabrication method of the present invention in accordance with the array of FIG. 3.

FIG. 5 illustrates that a polysilicon layer 501 is directionally deposited over the gate insulator 500. FIG. 6 illustrates that the polysilicon layer 500 is isotropically etched to create the floating gates 600-604.

Figure 7:
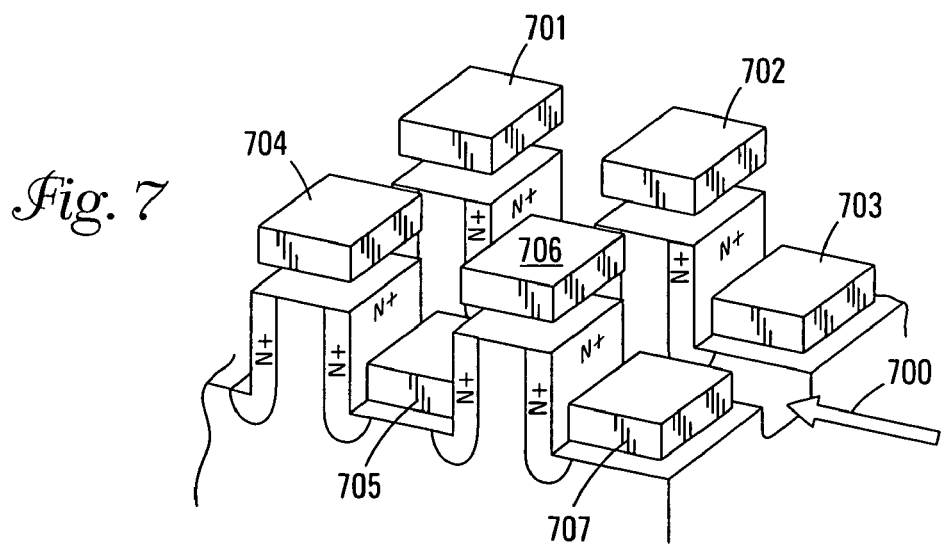
FIG. 7 shows a cross-sectional view of additional steps for one embodiment of the fabrication method of the present invention in accordance with the array of FIG. 3.

As is illustrated in FIG. 7, the structures are masked and trenches etched perpendicular 700 to the original trenches. This separates the floating gate structures 701-707 from the sidewalls and forms pillars with source/drain regions along two of the sidewalls. The second set of trenches is etched deeper into the substrate than the first set (i.e., 405 of FIG. 4) to affect a separation of the source/drain regions along the subsequent control gate or wordline.

The complete structure is filled with a deposited oxide and planarized by chemical mechanical polishing (CMP). The structure is masked and trenches opened up along the original directions exposing the separated floating gates at the bottom of these trenches. The polysilicon floating gates are oxidized or an intergate insulator is deposited and the polysilicon control gates and wordlines are deposited and separated by a short isotropic etch process in order to achieve the structure illustrated in FIG. 3. Each row of transistors in the upper plane are coupled together through the same wordline. Similarly, each row of the lower plane of transistors is coupled along the same wordline.

In operation, the stepped, non-planar flash memory devices of the present invention can be programmed with tunnel injection using positive gate voltages with respect to the substrate/p-well. In another embodiment, channel hot electron injection can be used in a programming operation. This is accomplished by applying a positive drain voltage (e.g., +6 to +9V) to a first source/drain region, a positive voltage to the control gate (e.g., +12V) and grounding the second source/drain region to create a hot electron injection into the gate insulator of the charge storage region.

An alternate embodiment programming operation uses substrate enhanced hot electron injection (SEHE). In this embodiment, a negative substrate bias is applied to the p-type substrate. This bias increases the surface lateral field near a source/drain region thus increasing the number of hot electrons. The benefit of such an embodiment is that a lower drain voltage is required during programming operations. In one embodiment, the negative substrate bias is in the range of 0V to –3V. Alternate embodiments may use other voltage ranges.

For an erase operation, one embodiment uses tunneling with conventional negative gate voltages with respect to the substrate/p-well. In another embodiment, the control gate is grounded, the drain connection is left floating and the source region has a positive voltage applied (e.g., +12V). Alternate embodiments for erase operations can use other methods such as substrate enhanced band-to-band tunneling induced hot hole injection (SEBBHH) that are well known in the art.

While above-described figures are to a NAND flash memory device, the present invention is not limited to such a structure. For example, using a virtual ground array that is well known in the art, the stepped, non-planar flash memory array can be fabricated in a NOR architecture. In the NOR configuration, the cells are arranged in a matrix. The gates of each floating gate memory cell of the array matrix are connected by rows to wordlines and their drains are connected to column bitlines. The source of each floating gate memory cell is typically connected to a common source line. Still other embodiments can use other architectures.

Figure 8:
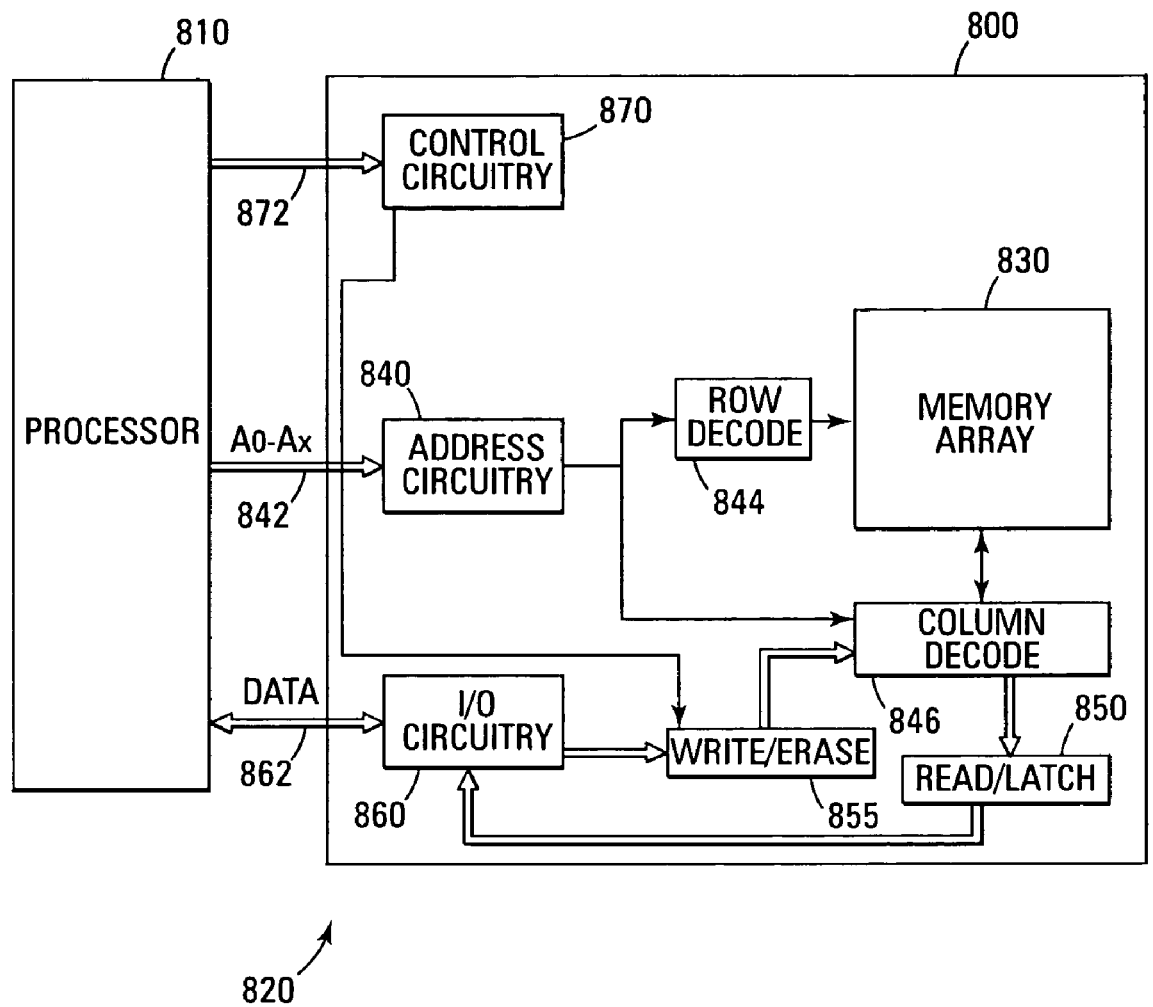
FIG. 8 shows a block diagram of an electronic system of the present invention.

FIG. 8 illustrates a functional block diagram of a memory device 800 that can incorporate the flash memory cells of the present invention. The memory device 800 is coupled to a processor 810. The processor 810 may be a microprocessor or some other type of controlling circuitry. The memory device 800 and the processor 810 form part of an electronic system 820. The memory device 800 has been simplified to focus on features of the memory that are helpful in understanding the present invention.

The memory device includes an array of flash memory cells 830 that can be comprised of the stepped, non-planar flash memory cells of the present invention. The memory array 830 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write (program), and erase operations. The control circuitry 870 may be a state machine, a sequencer, or some other type of controller.

The flash memory device illustrated in FIG. 8 has been simplified to facilitate a basic understanding of the features of the memory. A more detailed understanding of internal circuitry and functions of flash memories are known to those skilled in the art.

CONCLUSION

In summary, the stepped, non-planar flash memory cells of the present invention provide a high density memory array with single level storage. The density, in one embodiment, is 2 F2/bit versus the typical 4 F2/bit of the prior art conventional NAND flash memory structure. The memory cells of one row are divided up into an upper plane of cells and a lower plane of cells. In the NAND configuration, the cells are coupled in series through the source/drain regions. In the NOR configuration, the cells are arranged in a matrix.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a flash memory cell in a non-planar flash memory array comprising rows and columns of flash memory cells, each row of memory cells coupled on one of a first or a second plane, formed by pillars and trenches respectively, and each column of memory cells coupled on both the first and the second plane, each memory cell having a pair of source/drain regions, a gate insulator, a floating gate, and a control gate, the method comprising:

biasing the control gate, formed only on top of a pillar or in a bottom of a trench, with a first positive voltage;

biasing a first source/drain region located only in a first sidewall of the pillar with a second positive voltage; and grounding the remaining source/drain region located either only on a second sidewall of the pillar to create a hot electron injection only from a channel formed in the top of the pillar into a gate insulator of the floating gate located only over the top of the pillar or only on a second sidewall of the trench, opposite the first sidewall, to create hot electron injection only from a channel formed only in the bottom of the trench into a gate insulator of the floating gate located only over the bottom of the trench.

2. The method of claim 1 wherein the first positive voltage is +12V and the second positive voltage is in a range from +6V to +9V.

3. The method of claim 1 and further including applying a negative substrate voltage for substrate enhanced hot electron injection.

4. The method of claim 1 wherein the non-planar flash memory array is comprised of a NAND architecture.

5. The method of claim 1 wherein the non-planar flash memory array is comprised of a NOR architecture.

6. The method of claim 1 wherein the programming is accomplished by tunnel injection.

7. The method of claim 1 wherein the programming is accomplished by channel hot electron injection.

8. A method for erasing a flash memory cell of a non-planar flash memory array comprising rows and columns of flash memory cells, each row of memory cells coupled on one of a first or a second plane, formed by pillars and trenches respectively, and each colunm of memory cells coupled on both the first and the second plane, each memory cell having a pair of source/drain regions, a gate insulator, a floating gate, and a control gate, the method comprising:

biasing the control gate, formed only on top of a pillar or in a bottom of a trench; allowing a first source/drain region to float, the first source/drain region formed only in a sidewall of the pillar; and biasing the remaining source/drain region with a positive voltage, the remaining source/drain region formed either only in the remaining sidewall of the pillar wherein a channel region is formed only at the top of the pillar or the remaining source/drain region formed only in a sidewall of the trench opposite the first source/drain region wherein a channel is formed only at the bottom of the trench under the control gate.

9. The method of claim 8 wherein biasing the control gate comprises grounding the control gate.

10. The method of claim 8 wherein the positive voltage is +12V.

11. The method of claim 8 wherein biasing the control gate comprises biasing the control gate with a voltage that is negative with respect to a substrate voltage.

* * * * *

UNITED STATES PATENT AND TRADEMARK OFFICE
CERTIFICATE OF CORRECTION

PATENT NO. : 7,544,989 B2 Page 1 of 1
APPLICATION NO. : 11/472617
DATED : June 9, 2009
INVENTOR(S) : Leonard Forbes et al.

It is certified that error appears in the above-identified patent and that said Letters Patent is hereby corrected as shown below:

In column 8, line 32, in Claim 8, delete "colunm" and insert -- column --, therefor.

In column 8, lines 37-39, in Claim 8, after "trench;" delete "allowing a first source/drain region to float, the first source/drain region formed only in a sidewall of the pillar; and" and insert the same below "trench;", line 38, Col. 8, as a new paragraph.

Signed and Sealed this

Fourth Day of August, 2009

JOHN DOLL
*Acting Director of the United States Patent and Trademark Office*